United States Patent
Fujino

(10) Patent No.: US 9,660,634 B1
(45) Date of Patent: May 23, 2017

(54) LOAD DRIVING CIRCUIT

(71) Applicant: DENSO CORPORATION, Kariya, Aichi-pref. (JP)

(72) Inventor: Takeshi Fujino, Kariya (JP)

(73) Assignee: DENSO CORPORATION, Kariya (JP)

(*) Notice: Subject to any disclaimer, the term of this patent is extended or adjusted under 35 U.S.C. 154(b) by 0 days.

(21) Appl. No.: 15/185,095

(22) Filed: Jun. 17, 2016

(30) Foreign Application Priority Data

Nov. 26, 2015 (JP) .................................. 2015-230585

(51) Int. Cl.
*H03K 3/00* (2006.01)
*H03K 17/081* (2006.01)
*H03K 17/22* (2006.01)

(52) U.S. Cl.
CPC ..... *H03K 17/08104* (2013.01); *H03K 17/223* (2013.01)

(58) Field of Classification Search
None
See application file for complete search history.

(56) References Cited

U.S. PATENT DOCUMENTS 8,390,340 B2* 3/2013 Nakahara ............ H01L 27/0623
327/110
9,374,083 B2* 6/2016 Sawada .................. H03K 17/51

FOREIGN PATENT DOCUMENTS

| JP | H08-162931 A | 6/1996 |
| JP | 2013-255339 A | 12/2013 |
| JP | 2014-042394 A | 3/2014 |
| JP | 2014-175994 A | 9/2014 |

* cited by examiner

*Primary Examiner* — Long Nguyen
(74) *Attorney, Agent, or Firm* — Posz Law Group, PLC

(57) ABSTRACT

When a battery power supply voltage is applied to a drain of an output transistor at activation time, a drain-gate path of the output transistor is coupled and the output transistor tends to turn on by itself. A simplified power supply circuit operates in response to current conduction of a drain-source path of the output transistor. The simplified power supply circuit is activated at earlier time than activation of a power supply voltage Vcc of a logic power supply circuit, when the simplified power supply circuit operates with a main power supply voltage. The malfunction prevention circuit thus sets a gate voltage of the output transistor to a ground voltage by using an output generated by the simplified power supply circuit. As a result, malfunction of the output transistor is prevented at earlier time in comparison to malfunction prevention by initialization.

11 Claims, 12 Drawing Sheets

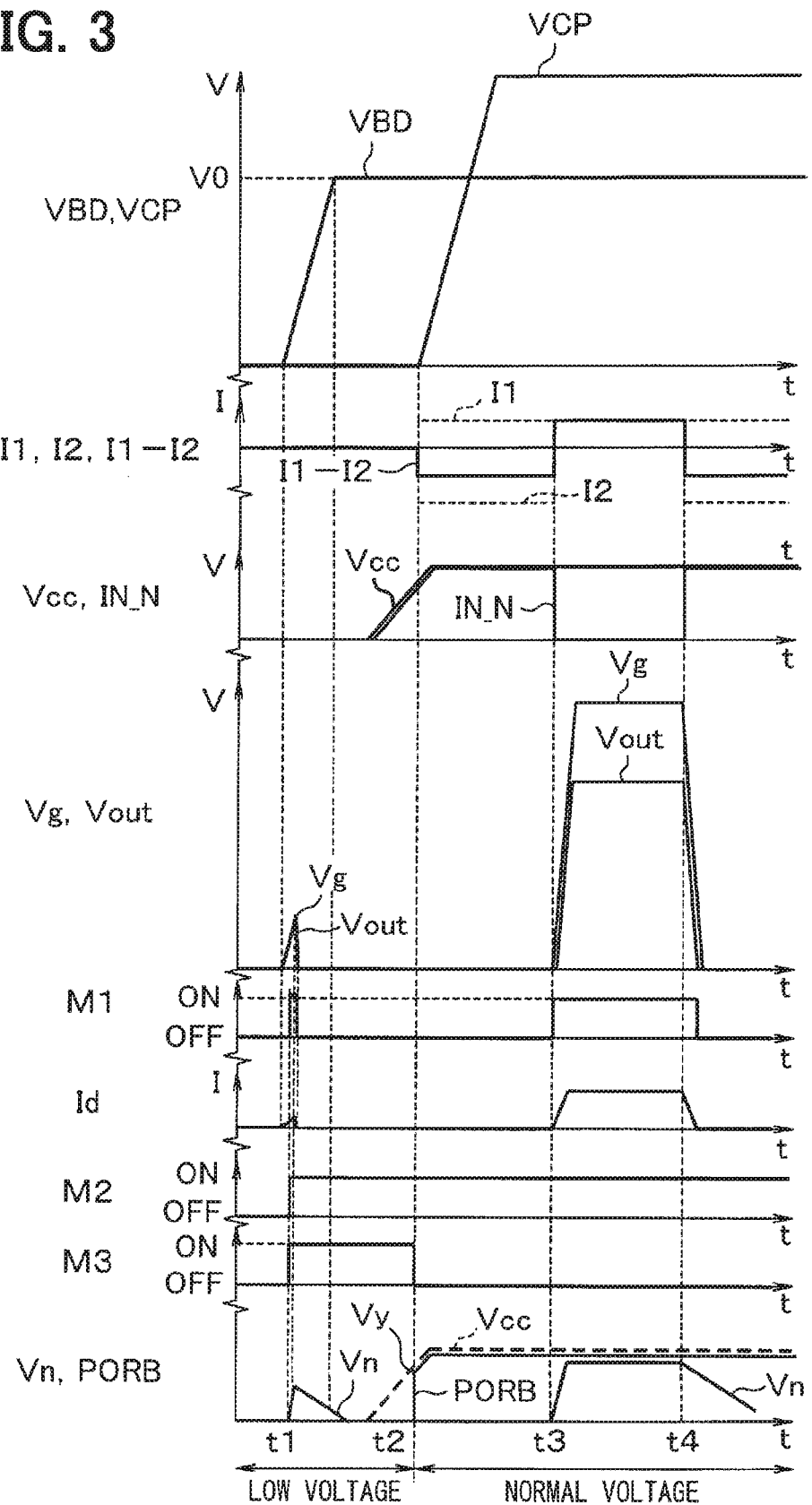

COMPARATIVE EXAMPLE

US 9,660,634 B1

LOAD DRIVING CIRCUIT

CROSS REFERENCE TO RELATED APPLICATION

This application is based on Japanese patent application No. 2015-230585 filed on Nov. 26, 2015, the content of which is incorporated herein by reference.

TECHNICAL FIELD

The present disclosure relates to a load driving circuit.

BACKGROUND ART

Exemplary load driving circuits are disclosed in JP 2014-175994 A (patent document 1). According to patent document 1, for switching over connection of a pull-down resistor in a configuration, which is not provided with a separate power supply source, a pull-down resistance element is validated to function as a pull-down resistor in a normal operation and is invalidated to control a gate terminal into a high impedance state at leak test time. The load driving circuit thus controls switchover of the resistor element without using a high-voltage power supply source and a negative power source.

The load driving circuit according to patent document 1 is capable of driving stably a load when a normal power supply voltage is supplied stably. However, when a main power supply voltage is activated, the main power supply voltage is unstable at the time of activation and the load driving circuit is likely to operate erroneously.

For example, in a case that the load driving circuit is configured with a MOS transistor as an output transistor, the MOS transistor is likely to turn on by itself in response to a rapid application of the main power supply voltage thereby causing malfunction of the load driving circuit. To counter this problem, it is proposed to pull down or pull up the gate of the MOS transistor by a resistor. If the gate is pulled down continuously, an output signal waveform of the MOS transistor is likely to be distorted or a quality inspection on the gate of the MOS transistor is likely to be impeded. To solve this problem, it is proposed to invalidate the pull-down by continuously supplying a current to a resistor. This current supply consumes more current.

It is alternatively proposed to prevent the malfunction by initializing the load driving circuit by using a separate logic circuit at the activation time of power supply. When the logic circuit operates with a sub-power supply voltage (for example, logic power supply voltage) of a sub-power supply circuit, which uses the main power supply voltage, it is hard to assure the circuit operation until the sub-power supply voltage rises to a voltage, which assures a normal operation. When the sub-power supply voltage rises with a large delay from a rise of the main power supply voltage, the sub-power supply circuit operates erroneously until it starts to operate normally.

It is further proposed in JP H08-162931 A (patent document 2) to prevent the malfunction described above by a differential circuit of a series circuit of a resistor and a capacitor. However, the capacitor need to have a large capacitance and not suitable for incorporation into a semiconductor integrated circuit.

SUMMARY OF THE DISCLOSURE

It is therefore an object of the present disclosure to provide a load driving circuit, which is operable with a main power supply voltage and a sub-power supply voltage, and more particularly to a load driving circuit, which drives its output transistor stably while preventing a malfunction operation at start time of activation.

A load driving circuit is provided to control power supply to a load connected to an output terminal by using a main power supply voltage supplied between two power supply nodes and a sub-power supply voltage generated from the main power supply voltage by a sub-power supply circuit. The load driving circuit comprises an output transistor, a pre-driver circuit and a malfunction prevention circuit. The output transistor has a control terminal and two power supply terminals, which are connected to one power supply node of the two power supply nodes and the output terminal. The pre-driver circuit applies a control signal corresponding to an input signal to the control terminal of the output transistor at normal time. The malfunction prevention circuit includes a simplified power supply circuit, which is provided at least partly in a power supply path connected in series with either one of the two power supply terminals of the output transistor, and which is activated in response to power supply to the two power supply terminals of the output transistor at activation time and earlier than activation of the sub-power supply voltage of the sub-power supply circuit by using the main power supply voltage at the activation time. The malfunction prevention circuit sets the control terminal of the output transistor to a predetermined voltage, which turns off the output transistor, by using an output voltage generated by the simplified power supply circuit. The malfunction prevention circuit invalidates the predetermined voltage set at the control terminal of the output transistor, when the sub-power supply voltage of the sub-power supply circuit changes from a pre-activation voltage to a normal operation assurance voltage, which assures a normal operation of an entirety of the load driving circuit, after setting of the predetermined voltage at the control terminal of the output transistor.

BRIEF DESCRIPTION OF THE DRAWINGS

FIG. 3 is a timing chart generally showing an on/off state of each transistor and a signal change at each node in the first embodiment;

EMBODIMENT OF THE DISCLOSURE

Figure 1:
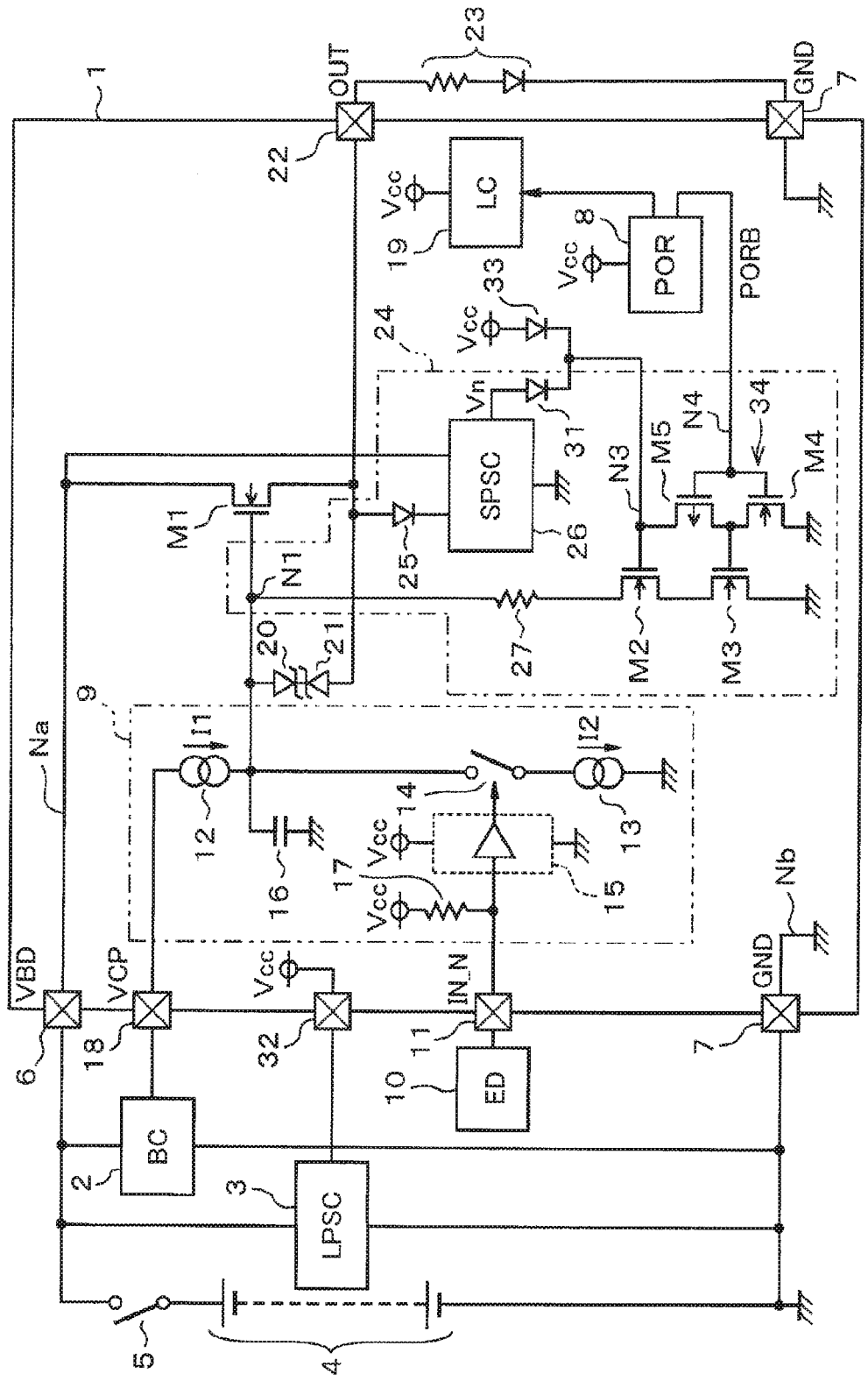
FIG. 1 is an electric circuit diagram generally showing a first embodiment of a load driving circuit.

A load driving circuit will be described with reference to plural embodiments shown in the drawings. Structural elements having same or similar functions among the embodiments are designated with same or similar reference numerals thereby simplifying the description.

In the embodiments described below, a gate of a MOS transistor or a base of a bipolar junction transistor is assumed to be one example of a control terminal, and a drain and a source of the MOS transistor or a collector and an emitter of the bipolar junction transistor are assumed to be examples of power supply terminals.

First Embodiment

FIG. 1 to FIG. 4 show a first embodiment. Referring to FIG. 1 showing an exemplary electric configuration of a load driving circuit 1, the load driving circuit 1 is configured with a semiconductor integrated circuit device such as an ASIC (application specific integrated circuit). The load driving circuit 1 is configured to include an N-channel power MOSFET M1 as an output transistor in a semiconductor chip and circuits provided in peripheral parts of the output transistor M1 for driving the output transistor M1.

A booster circuit (BC) 2, a logic power supply circuit (LPSC) 3 as a sub-power supply circuit, a battery 4, a power supply switch 5 and the like are provided at an external side of the load driving circuit 1. A battery power supply voltage VBD of the battery 4 is set to be about 12V as a main power supply voltage. The battery power supply voltage VBD of the battery 4 is applied to two terminals 6 and 7, which are two power supply nodes, in response to a turn-on operation of the power supply switch 5. Thus the load driving circuit 1 supplies the battery power supply voltage VBD when the power supply switch 5 is turned on.

The booster circuit 2 is configured to operate when a power-on reset (POR) signal is applied from a power-on reset circuit 8, which is provided inside the load driving circuit 1, for example. The booster circuit 2 steps up the battery power supply voltage VBD and supplies the stepped-up voltage VCP of about 24V, for example, to the load driving circuit 1. The logic power supply circuit 3 steps down the battery power supply voltage VBD and supplies a stabilized power supply voltage Vcc of about 5V as a sub-power supply voltage, for example, to the load driving circuit 1.

A pre-driver circuit 9 is provided as an input side circuit in an internal part of the load driving circuit 1. The pre-driver circuit 9 operates with the power supply voltage Vcc and the stepped-up voltage VCP, for example, in a normal operation and generates a control signal, which corresponds to a logic signal applied from the external device (ED) 10 to a control signal input terminal 11. The pre-driver circuit 9 has a through-rate control function for controlling a through-rate of the output transistor M1 at on/off time by controlling current charge and current discharge relative to a gate (gate node N1) of the output transistor M1.

The pre-driver circuit 9 includes, for example, current sources 12, 13, a switch 14, a buffer 15 and a capacitor 16, which holds a gate voltage of the output transistor M1. A pull-up resistor 17 is provided at an input stage of the pre-driver circuit 9. The current source 12 is connected between a supply terminal 18 of the stepped-up voltage VCP and the gate of the output transistor M1 to generate a constant current I1 by using the stepped-up voltage VCP and apply it to the gate of the output transistor M1. In the normal operation, the current source 12 supplies the constant current I1.

The switch 14 and the current source 13 are connected in series between the gate of the output transistor M1 and the ground. In the normal operation, the current source 13 draws a constant current I2, which is larger than the constant current I1 from the gate node N1 of the output transistor M1. The switch 14 has a control terminal. When the external device 10 outputs a logic input signal IN_N to the terminal 11, it is applied to the control terminal of the switch 14. The switch 14 turns on or off in response to the control signal applied to the terminal 11. When the switch 14 in in an off-state, a gate voltage of the gate node N1 of the output transistor M1 increases as the constant current I1 of the current source 12 charges the capacitor 16. When the switch 14 is turned on, the current source 13 draws by the current I2 (>I1) electricity charged in the capacitor 16 of the gate node N1 of the output transistor M1. Thus the gate voltage of the output transistor M1 is regulated. Since the current sources 12 and 13 apply the current I1 to the gate of the output transistor M1 and draw the current I2 from the gate of the same, the driving voltage is shaped in a trapezoidal voltage waveform thereby controlling the through rate. As a result, the output transistor M1 is turned on or off.

The power-on reset circuit 8 is provided inside the load driving circuit 1. The power-on reset circuit 8 is used as a detection circuit for detecting the logic power supply voltage Vcc. It is a rest circuit, which resets internal logic circuits 19 and, for example, the booster circuit 2 in accordance with a voltage inputting the logic power supply voltage Vcc. As described later, according to the first embodiment, the power-on reset circuit 8 prevents erroneous operations (malfunctions) of circuits by using its output signal PORB. The output signal PORB is an inverted signal of the power-on reset signal POR.

Two Zener diodes 20 and 21 are connected between the gate and the source of the output transistor M1 in a manner to oppose each other. The Zener diodes 20 and 21 are provided as a protection circuit for protecting the gate of the output transistor M1. The source of the output transistor M1 is connected to an electric load 23 through an output terminal 22. The load 23 is an LED, for example, which is shown as an equivalent circuit in in FIG. 1. When the pre-driver circuit 9 drives the output transistor M1 to turn on, the load 23 is powered with the battery power supply voltage VBD. When the pre-driver circuit 9 drives the output transistor M1 to turn off, the load 23 is not powered.

A malfunction prevention circuit 24 is provided among the gate, the source and the ground of the output transistor M1. The malfunction prevention circuit 24 includes a diode 25, a simplified power supply circuit 26, N-channel MOS transistors (referred to as transistors hereinafter) M2, M3, M5, a resistor 27 and a P-channel MOS transistor (referred to as a transistor) M4 and is configured to prevent the output transistor M1 from operating erroneously when the battery power supply voltage VBD changes rapidly. The transistors M2 and M3 are used as a fourth transistor.

Configuration of the malfunction prevention circuit 24 will be described in more detail below. An anode-cathode path of the diode 25 and the simplified power supply circuit 26 are connected in series between the source of the output transistor M1 and the ground. The diode 25 may be formed of a single diode element or plural diode elements connected in parallel. In a case that the plural diode elements are connected in parallel, an allowable quantity of a current, which flows into the simplified power supply circuit 26, may be increased.

The simplified power supply circuit 26 generates a simplified power supply voltage Vn by using a current, which flows from the source of the output transistor M1 and the battery power supply voltage VBD. For example, the simplified power supply circuit 26 is configured such that its response characteristic of the output voltage change relative to its input voltage change is more speedy than that of the logic power supply circuit 3. For example, examples of the simplified power supply circuit 26 are shown in FIG. 2A and FIG. 2B.

Figure 2A:
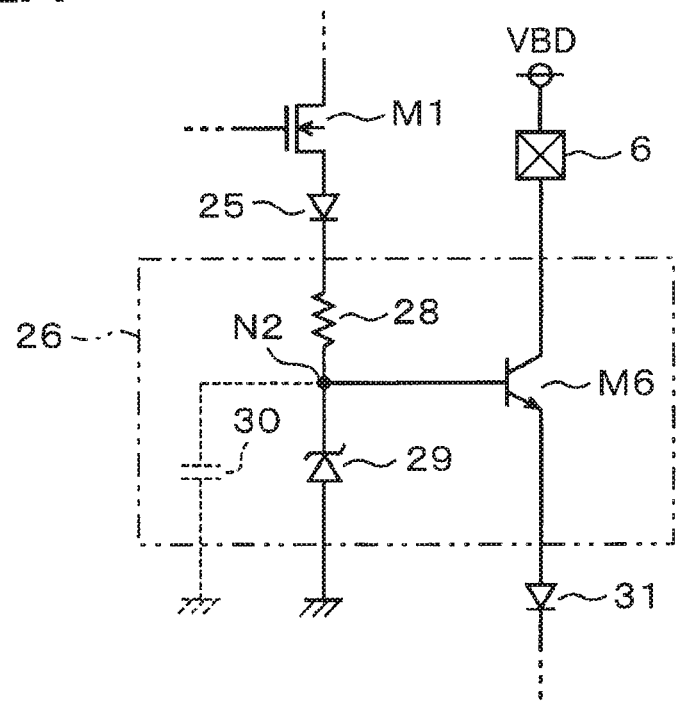
FIG. 2A and FIG. 2B are electric circuit diagrams showing simplified power supply circuit in the first embodiment.
Figure 2B:
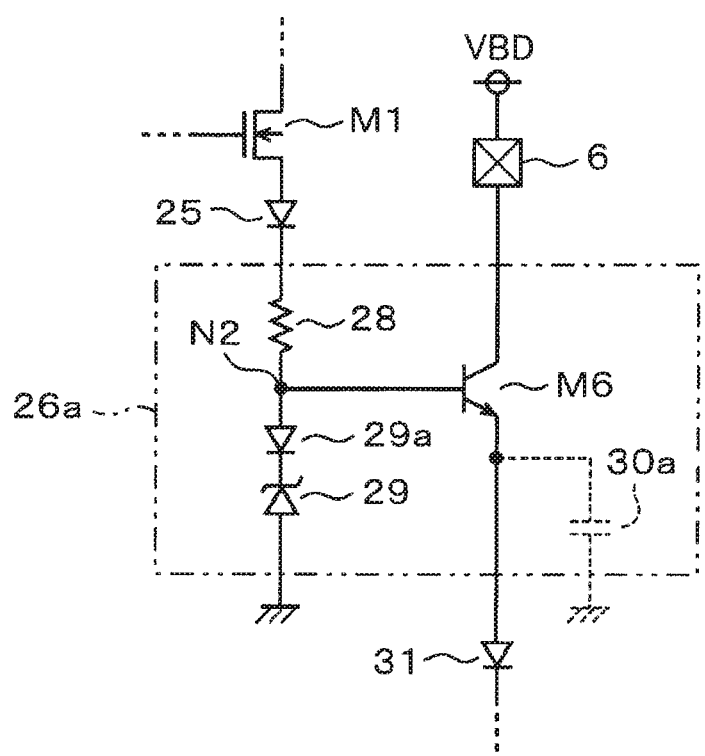

As shown in FIG. 2A, the simplified power supply circuit 26 includes a resistor 28 and a reverse-biased Zener diode 29, which are connected in series between the cathode of the diode 25 and the ground, and an NPN-type bipolar transistor (referred to as a transistor hereinafter) M6, the base of which is connected as the control terminal to a common connection node N2 between the resistor 28 and the reverse-biased Zener diode 29. Since the simplified power supply circuit 26 is configured inside the semiconductor integrated circuit, a parasitic capacitance 30 of about several picofarads (pF) exists at the common connection node N2, which is common to the resistor 28 and the cathode of the reverse-biased Zener diode 29. In the following description, the parasitic capacitance 30 is assumed to be provided at the node N2 as shown in FIG. 2A although not limited. Alternatively, a simplified power supply circuit 26a may be configured as shown in FIG. 2B, with a variety of parasitic capacitances. As shown in FIG. 2B, a forward-biased diode 29a may be provided separately between the node N2 and the cathode of the reverse-biased diode 29. As shown in FIG. 2B, a parasitic capacitance 30a may be assumed to exist at the common connection node between the anode of the diode 31 and the emitter of the transistor M6. Further, a parasitic capacitance, which exists at the cathode of the diode 31, may be assumed in place of or in addition to the parasitic capacitance 30 described above. The transistor M6 is used as a second transistor. It is not limited to the NPN bipolar transistor but may be a PNP bipolar transistor, with which the circuit configuration may be modified correspondingly. Further, an N-channel or P-channel MOS transistor may be used and the circuit configuration may be modified correspondingly.

The transistor M6 has a collector connected to the battery power supply voltage terminal 6 of the battery power supply voltage VBD and an emitter connected to an anode of the diode 31. As shown in FIG. 1, the emitter of the transistor M6, which is an output of the simplified power supply circuit 26, is connected to a gate node N3 of the transistor M2 through an anode-cathode path of the diode 31. Since the logic power supply circuit 3 is connected to the power supply terminal 32 of the power supply voltage Vcc, the power supply voltage Vcc is supplied from the logic power supply circuit 3 to the power supply terminal 32. The terminal 32 is also connected to the gate node N3 of the transistor M2 through the anode-cathode path of the diode 33.

An inverter 34 is connected between the gate node N3 of the transistor M2 and the ground. The inverter 34, which is provided as a first inverter, is configured with transistors M3, M4 and M5. A source-drain path of the transistor M5 and a drain-source path of the transistor M4 are connected in series. Gates of the transistors M4 and M5 are connected to a node N4 in common. An output terminal of the inverter 34 is connected to the gate of the transistor M3.

The output signal PORB of the power-on reset circuit 8 is connected to the common connection node N4, which is an input terminal of the inverter 34. Since the transistors M4 and M5 turn on and off complementarily, the transistors M4 and M5 turn on and off complementarily in response to the output signal PORB of the power-on reset circuit 8.

When the power supply voltage Vcc is supplied to the gate node N3 of the transistor M2 for example under a state that the power-on reset circuit 8 maintains the voltage of the output signal PORB to be low, the transistor M5 turns on and the transistor turns off. In this case, the power supply voltage Vcc is supplied to the gates of both of the transistors M2 and M3 from the simplified power supply circuit 26 and the logic power supply circuit 3 and both of the transistors M2 and M3 turn on. Then the operation of the malfunction prevention circuit 24 is validated, that is, made effective, and the charged electricity of the gate node N1 of the output transistor M1 is discharged to the ground through the resistor 27 and the transistors M2 and M3.

When the power-on reset circuit 8 raises the voltage of the output signal PORB, the transistor M5 turns off and the transistor M4 turns on. In this case, the output voltage of the simplified power supply circuit 26 is supplied to the gate node N3 of the transistor M2 through the diode 31 but the gate of the transistor M3 is pulled down to the ground by the transistor M4. As a result, the transistor M3 turns off. The gate of the output transistor M1 is rendered to be non-conductive to the ground and the operation of the malfunction prevention circuit 24 is invalidated, that is, not made effective. Thus the transistors M2 and M3 render the gate of the output transistor M1 to be conductive or non-conductive.

An operation from activation to a normal operation state will be described below. FIG. 3 shows generally changes of the voltage at each node, current, on/off states of the transistors relative to time. In FIG. 3, I1, I2, Vg, Id and Vn indicate a current value of the current source 12, a current value of the current source 13, a gate voltage of the output transistor M1, a drain current of the output transistor M1 and an output voltage of the simplified power supply circuit 26, respectively.

As show in FIG. 3, when the power supply switch 5 is turned on and the battery power supply voltage VBD is supplied, the drain and the gate of the output transistor M1 are coupled through the parasitic capacitance, which exists between the drain and the gate of the output transistor M1, and the gate capacitance of the output transistor M1 is charged. When the gate capacitance of the output transistor M1 is charged, the gate voltage of the output transistor M1 rises. As a result, the output transistor M1 turns on by itself. When the output transistor M1 turns on by itself, the battery power supply voltage VBD is supplied to the simplified power supply circuit 26 of the malfunction prevention circuit 24 through the output transistor M1.

Since the output voltage of the simplified power supply circuit 26 changes more speedily than the logic power supply circuit 3 does, for example, the output voltage Vn of the simplified power supply circuit 26 rises more speedily than the power supply voltage Vcc of the logic power supply circuit 3 does. Since the power-on reset signal POR is not applied, the booster circuit 2 does not generate the output voltage VCP. In the case of the circuit configuration of FIG. 2A, for example, the simplified power supply circuit 26 raises the base voltage of the NPN transistor M6 at earlier time by the resistor 28 and the Zener diode 29. The transistor M6 turns on quickly in response to the rise of its base voltage and supplies the battery power supply voltage VBD through the collector-emitter path of the transistor M6. As a result, the transistor M6 supplies the current to the gate node N3 of the transistor M2 through the diode 31.

The power-on reset circuit 8 maintains its output voltage PORB at the ground voltage 0V before activation and continues to reset the booster circuit 2 and the load driving circuit 19 by using the output signal POR.

When the power-on reset circuit 8 applies the ground voltage 0V of the output signal PORB to the control terminal of the inverter 34, the transistor M5 of the inverter 34 turns on in response to the rise of the output voltage Vn of the simplified power supply circuit 26 and the output voltage Vn of the simplified power supply circuit 26 is applied to the gate of the transistor M3 through the diode 31 and the source-drain path of the transistor M5. Thus the transistor M3 turns on. Since both of the transistors M2 and M3 turn on at time point t1, the gate node N1 of the output transistor M1 is pulled down. When the gate of the output transistor M1 is grounded to 0V, the output transistor M1 gradually turns off.

Even when the output transistor M1 turns off, the output voltage Vn of the simplified power supply circuit 26 is maintained by the charge voltage of the parasitic capacitance 30 forming the simplified power supply circuit 26. When the battery power supply voltage VBD changes to a set voltage V0 at the time of activation and finishes changing, the coupling through the drain-gate capacitance of the output transistor M1 also ends and the output transistor M1 stops turning on by itself. Therefore, until at least the battery power supply voltage VBD changes to the set voltage V0 at the time of activation, the transistors M2 and M3 are preferably turned on continuously by maintaining the charge of the parasitic capacitance 30 by the simplified power supply circuit 26 and maintaining the output voltage Vn to be higher than the ground voltage 0V.

When the battery power supply voltage VBD generally finishes rising at the activation time and the simplified power supply circuit 26 discharges the power stored in the parasitic capacitance 30, the output voltage Vn of the simplified power supply circuit 26 falls. Since the battery power supply voltage VBD normally outputs the voltage, which reached the set voltage V0, the self turn-on is not generated and the output transistor M1 continues to be in the off-state. Since the simplified power supply circuit 26 automatically changes to an inoperative state at this time, the power is not outputted continuously and hence power consumption is lowered.

As described above, even when the transistor makes a self turn-on in response to the application of the battery power supply voltage VBD to the drain of the output transistor M1, the gate of the output transistor M1 is pulled down immediately and the output transistor M1 turns off. As a result, it is possible to prevent the output transistor M1 from erroneously turning on in response to the rapid application of the battery power supply voltage VBD.

Then the logic power supply circuit 3 raises its output voltage Vcc by using the battery power supply voltage VBD. The power-on reset circuit 8 detects the output voltage Vcc of the logic power supply circuit 3. When the output voltage Vcc of the logic power supply circuit 3 reaches a voltage Vy (for example, 3.3V), which assures normal operation of the logic power supply circuit 3, the power-on reset circuit 8 raises the voltage of the output signal PORB to a value close to the power supply voltage Vcc and then sets the output signal PORB to be equivalent to the power supply voltage Vcc. The normal operation assurance voltage Vy assures that the load driving circuit 1 is operable normally. Thus the power supply voltage Vcc supplied to the load driving circuit 1 is determined to be in the normal state. The power-on reset circuit 8 initializes the load driving circuit 1 by releasing the logic circuit 19 from the reset state and the logic circuit 19 changes to the normal operation state.

At this time, the power-on reset circuit 8 outputs the output signal PORB to the inverter 34 so that the output of the inverter 34 is changed to the ground voltage 0V. The transistor M3 then turns off and the gate of the output transistor M1 is rendered to be non-conductive. Thus the operation of the malfunction prevention circuit 24 is invalidated.

After the above-described operation, the load driving circuit 1 operates normally. When the input signal IN_N is applied from the external device 10, the pre-driver circuit 9 applies the control signal to the control terminal of the output transistor M1 in response to the input signal IN_N and turns on or off the output transistor M1. For example, when the output transistor M1 turns off, no power is supplied to the simplified power supply circuit 26 and hence the simplified power supply circuit 26 stops outputting. Although the logic power supply circuit 3 continues to supply the power supply voltage Vcc to the gate of the transistor M2, the power-on reset circuit 8 continues to fix the output of the inverter 34 to the ground voltage 0V and hence the transistor M3 continues to be in the off-state. As a result, the gate of the output transistor M1 is continuously rendered to be non-conductive. When the output transistor M1 turns on, the simplified power supply circuit 26 starts outputting the output voltage Vn. However, since the power-on reset circuit 8 similarly continues to fix the output of the inverter 34 to the ground voltage 0V, the transistor M3 continues to be in the off-state. As a result, the gate of the output transistor M1 continues to be non-conductive and the malfunction prevention circuit 24, which uses the simplified power supply circuit 26, does not affect on the normal operation.

Figure 4:
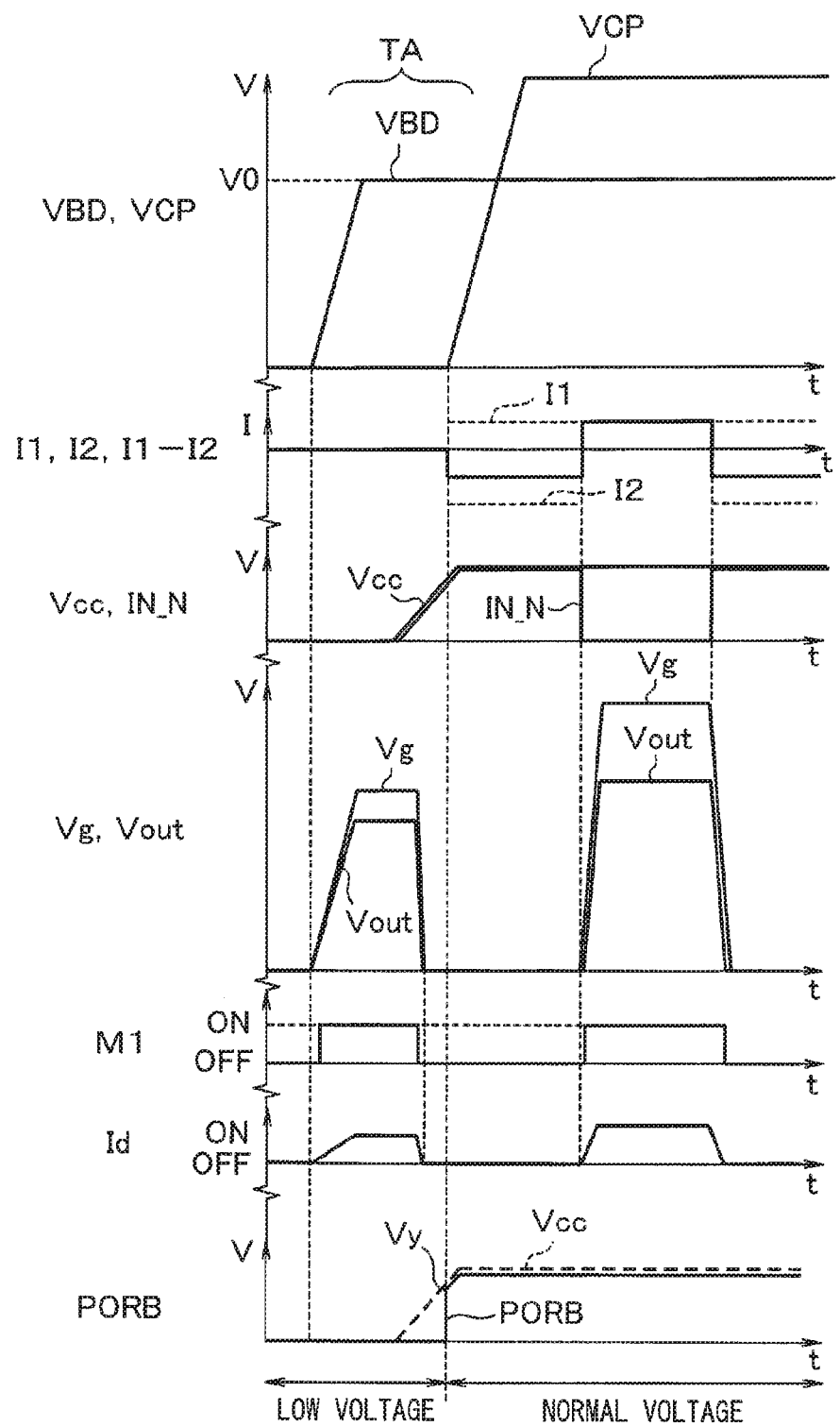
FIG. 4 is a timing chart showing a comparative example in correspondence to FIG. 3.

FIG. 4 shows an operation of a comparative example. In this comparative example, it is assumed that the malfunction prevention circuit 24 such as the simplified power supply circuit 26 and the transistors M2 and M3 is not provided. For example, when the state of the output transistor M1 is non-conductive at the time of activation, the battery power supply voltage VBD rapidly rises as shown in a period TA of FIG. 4 and the drain and the gate of the output transistor M1 is coupled. Thus the output transistor M1 continues to turn on by itself.

Further, the pre-driver circuit 9, which has a function of through rate control, applies the voltage of the trapezoidal waveform to the gate node N1 of the output transistor M1 by supplying and drawing the constant currents to and from the gate capacitance of the output transistor M1, respectively. Even when the output voltage VCP of the booster circuit 2 and the output voltage of the logic power supply circuit 3 are insufficient before and after the activation time, the pre-driver circuit 9 needs to maintain the output transistor M1 in the off-state. In a case that the pull-down resistor is continuously connected to the gate of the output transistor M1, the trapezoidal waveform generated by the pre-driver circuit 9 is likely to be distorted. To counter to this distortion, a buffer amplifier may be provided at a pre-stage of the pre-driver circuit 9. In a case that an ASIC, which has multiple channel pre-driver circuit outputs, is used, a buffer amplifier may be provided for each channel.

According to the configuration of the first embodiment shown in FIG. 1, when the battery power supply voltage VBD is supplied to the battery power supply terminal 6 in response to the turn-on of the power supply switch 5, the output transistor M1 tends to turn on by itself. At this time, the simplified power supply circuit 26 is activated in accordance with the current flow in the drain-source path of the output transistor M1. The malfunction prevention circuit 24 speedily sets the gate of the output transistor M1 to the ground voltage 0V by using the output of the simplified power supply circuit 26 generated at the time of activation. As a result, it is possible to prevent the malfunction, that is, erroneous operation, even when the battery power supply voltage VBD is rapidly increased and inputted.

When the power supply voltage Vcc of the logic power supply circuit 3 changes from the voltage of the logic power supply circuit 3 generated before the activation to the normal operation assurance voltage Vy after the gate of the transistor is set to the ground voltage 0V, the malfunction prevention circuit 24 thereafter renders the gate of the output transistor M1 to be non-conductive thereby to invalidate fixing of the power supply voltage Vcc to the ground voltage 0V.

Since the gate of the output transistor M1 need not be pulled down continuously, it is possible to reduce the distortion of the trapezoidal waveform voltage generated by the pre-driver circuit 9. As a result, it is possible to reduce the distortion of the output waveform of the output transistor M1 as much as possible and easily perform quality inspection on the control terminal of the output transistor M1. Even in the case that the ASIC of multi-channel type, it is possible to reduce a circuit area and power consumption relative to a configuration, in which a buffer amplifier is provided.

At the time of activation, the simplified power supply circuit 26 continues to apply power to the gate node N3 of the transistor M2 through the emitter of the NPN transistor M6 until at least the battery power supply voltage VBD rises to the set voltage V0 at the activation time in accordance with the current flowing in the resistor 28. For this reason, the output transistor M1 is maintained in the off-state for a required period.

Since a predetermined voltage applied to the gate of the output transistor M1 is set to the ground voltage 0V, it is possible to surely turn off the output transistor M1. When the power-on reset circuit 8 detects that the power supply voltage Vcc of the logic power supply circuit 3 reached from the ground voltage 0V, which is a pre-activation voltage, to the normal operation assurance voltage Vy (for example, 3.3V), the transistor M3 turns off and renders the gate of the output transistor M1 to be non-conductive. It is thus possible to render the gate of the output transistor M1 and cause the output transistor M1 to operate effectively after the detection that the power supply voltage Vcc of the logic power supply circuit 3 rose to the normal operation assurance voltage Vy. Thus reliability of operation is improved.

Since the load driving circuit 1 is configured as the semiconductor integrated circuit, it is possible to be configured without a capacitor of large capacitance and eliminate necessity of assembling a capacitor, which requires a large area, into the semiconductor integrated circuit. As a result, it is possible to reduce a circuit size.

Second Embodiment

Figure 5:
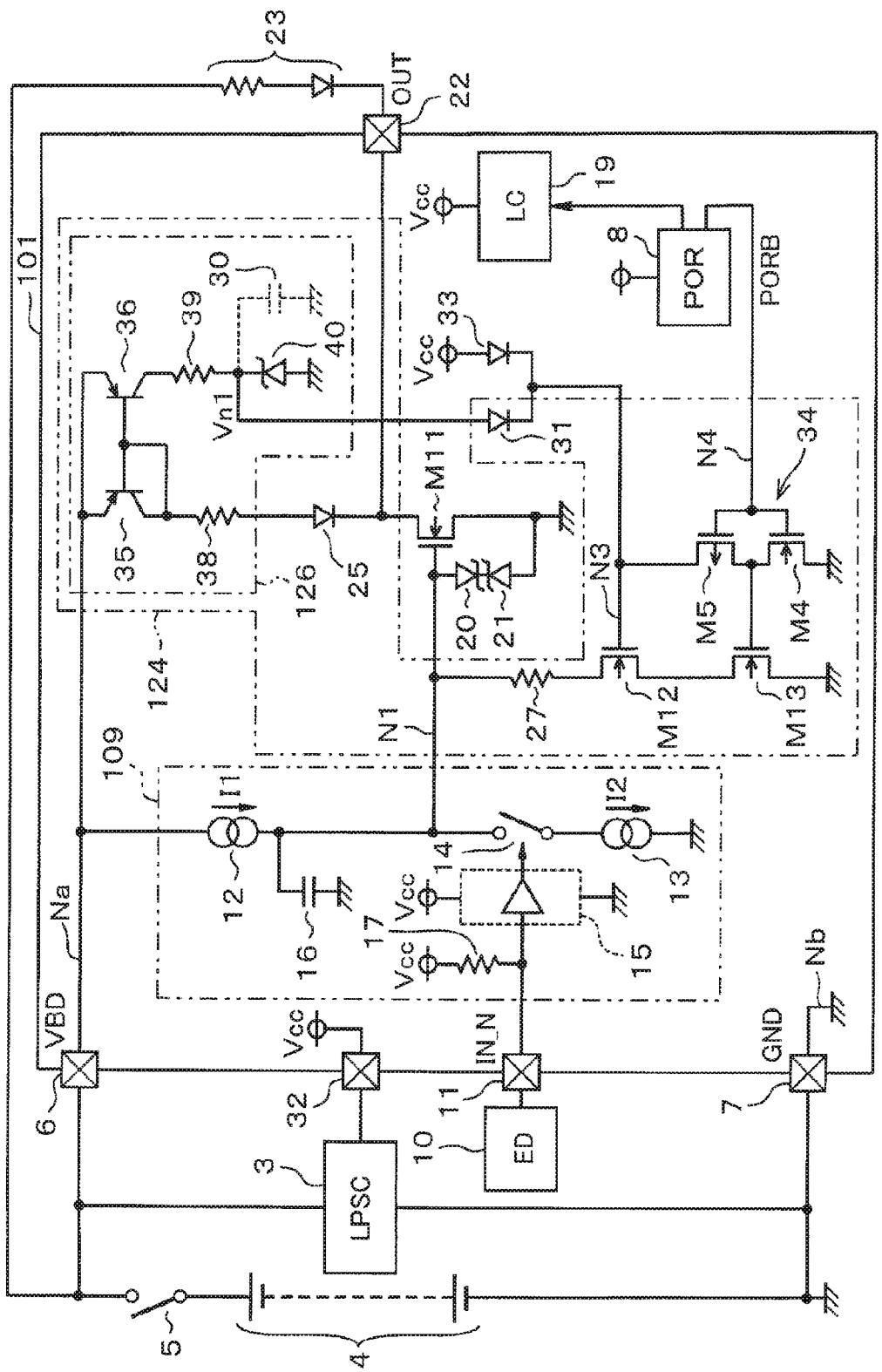
FIG. 5 is an electric circuit diagram generally showing a second embodiment of a load driving circuit.
Figure 6:
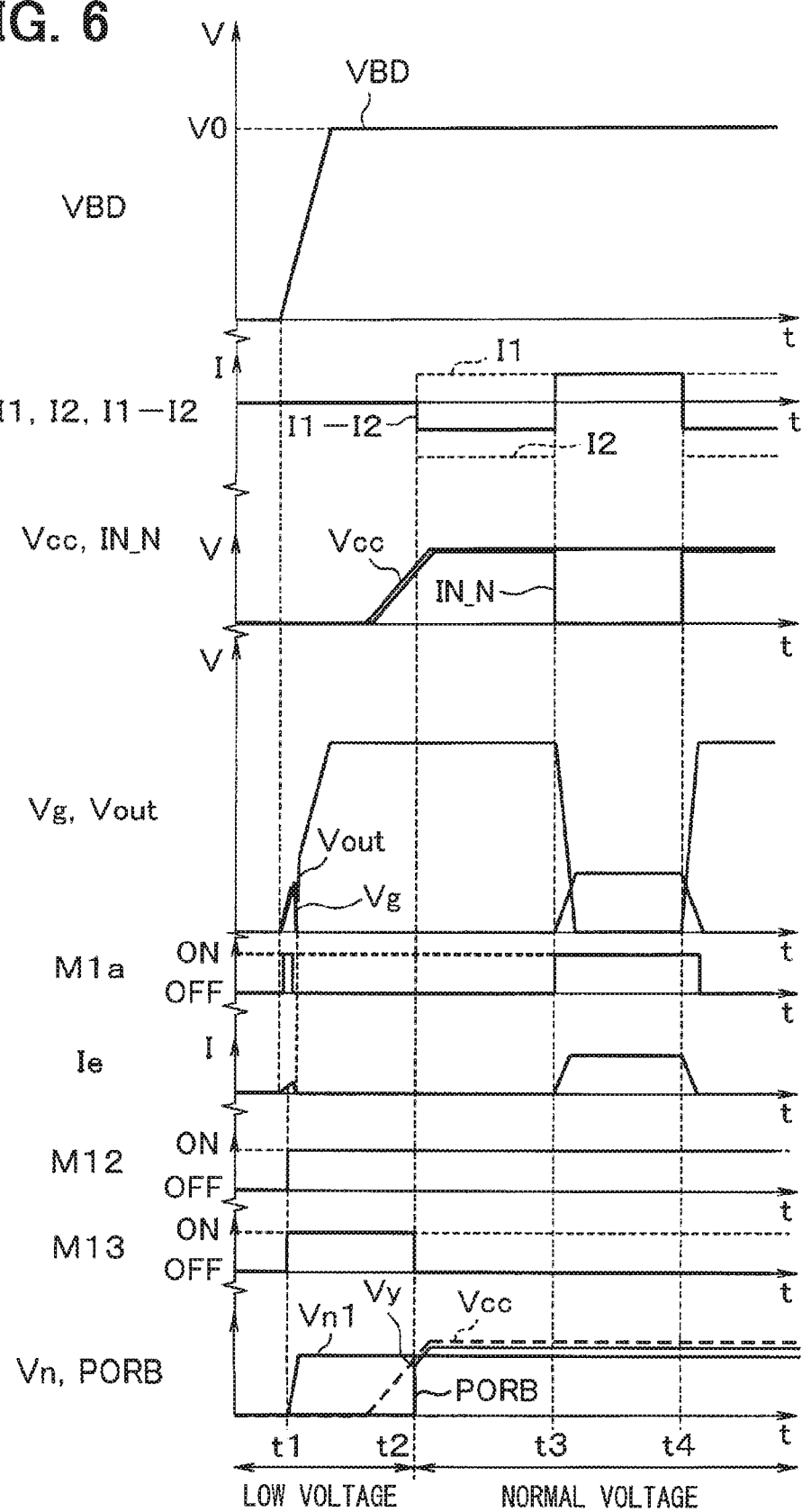
FIG. 6 is a timing chart generally showing an on/off state of each transistor and a signal change at each node in the second embodiment.

FIG. 5 and FIG. 6 show additional explanatory diagrams of a second embodiment. FIG. 5 shows an exemplary configuration of a load driving circuit 101 according to the second embodiment. FIG. 6 shows a timing chart generally corresponding to this exemplary configuration. In the load driving circuit 101 of FIG. 5, the output transistor M1 in the first embodiment is indicated as an output an output transistor M11 and the transistors M2, M3 in the first embodiment are indicated as transistors M12, M13, respectively, for brevity of description. The transistor M13 is used as a third transistor.

As shown in FIG. 5, the battery power supply voltage VBD is supplied to the load 23 through the power supply switch 5. The load driving circuit 101, which is provided in place of the load driving circuit 1, includes a pre-driver circuit 109 in place of the pre-driver circuit 9 and a malfunction prevention circuit 124 are provided in place of the malfunction prevention circuit 24. The pre-driver circuit 109 generates a trapezoidal waveform voltage by supplying to and drawing from the output transistor M11 currents by using the battery power supply voltage VBD and applies it to the gate node N1 of the output transistor M11. The pre-driver circuit 109 controls current supply to the load 23 by controlling the output terminal 22 of the load driving circuit 101 to a voltage close to the battery power supply voltage VBD or the ground voltage 0V.

The malfunction prevention circuit 124 includes a simplified power supply circuit 126 at a drain side of the output transistor M11. The simplified power supply circuit 126 is formed of, as main component parts, PNP transistors 35, 36, resistors 37, 38 and a Zener diode 40. A diode-connected PNP transistor 35 and a resistor 38 are connected in series between the battery power supply terminal 6 of the battery power supply voltage VBD and a drain of the output transistor M11. A diode 25, which prevents a reverse current flow, is connected between the battery power supply terminal 6 of the battery power supply voltage VBD and the drain of the output transistor M11. The PNP transistor 36 is connected to the PNP transistor 35 in a current mirror form. A series circuit of a resistor 39 and a reverse-biased Zener diode 40 are connected in series between a collector of the PNP transistor 36 and the ground.

The simplified power supply circuit 126 uses as its output a common connection node between the resistor 39 and a cathode of the Zener diode 40. This output is connected to a gate of the transistor M12 through a diode 31. The other configuration is similar to the first embodiment described above and hence no further description will be made.

When the battery power supply voltage VBD is applied to the load driving circuit 101 by turning on of the power switch 5 as shown in FIG. 6, the battery power supply voltage VBD is applied to the drain of the output transistor M11 through the load 23. This applied voltage charges the capacitor 16 through the gate capacitance, which is parasitic between the drain and the gate of the output transistor M11. The output transistor M11 responsively turns on by itself. At this moment, the simplified power supply circuit 126 outputs the output voltage Vn1 to the gate node N1 of the output transistor M12 through the diode 25. Similarly to the operation of the first embodiment, the transistors M12 and M13 turn on at time point t1. As a result, the voltage Vout of the output terminal 22 rises to the battery power supply voltage VBD but the gate of the output transistor M11 is pulled down. When the battery power supply voltage VBD is supplied, the simplified power supply circuit 126 sets the output voltage Vn1 at a predetermined level and continues to maintain it.

The power-on reset circuit 8 changes its operation state to a normal voltage state upon detection of the normal operation assurance voltage Vy at time point t2 and the output transistor M13 turns off. Thus the gate node N1 of the output transistor M11 is rendered to be non-conductive and the malfunction prevention circuit 124 is invalidated.

As long as the pre-driver circuit 109 turns off the output transistor M11 in a period from time point t2 to time point t3, the voltage Vout (OUT) of the output terminal 22 is generally equal to the battery power supply voltage VBD. However, when the pre-driver circuit 109 turns on the output transistor M11 at time point t3, the voltage Vout of the output terminal 22 is the ground voltage 0V. The other operation is the same as the first embodiment and hence no more description is made. The second embodiment also provides the similar operation and advantage as the first embodiment.

Third Embodiment

Figure 7:
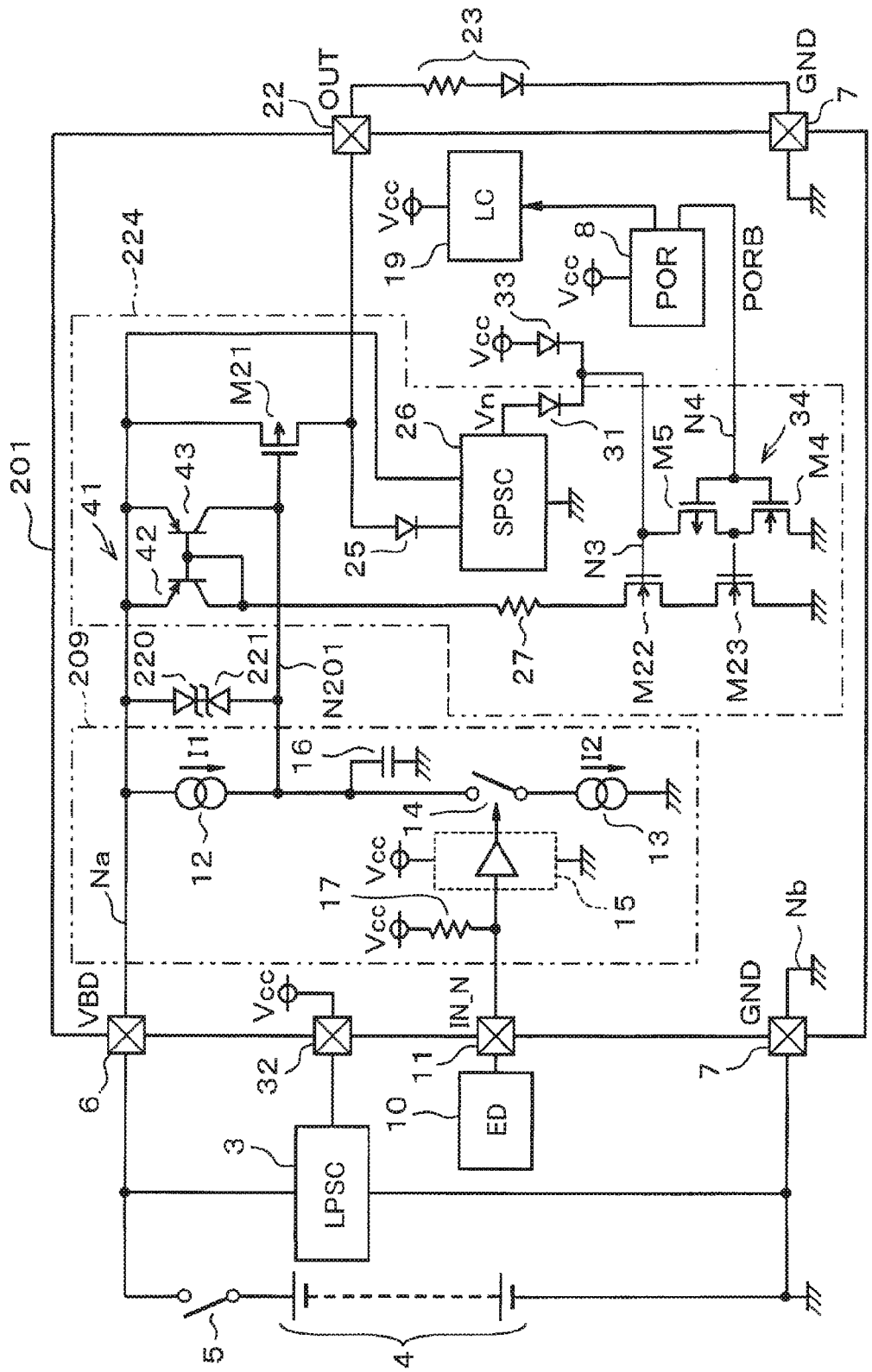
FIG. 7 is an electric circuit diagram generally showing a third embodiment of a load driving circuit.
Figure 8:
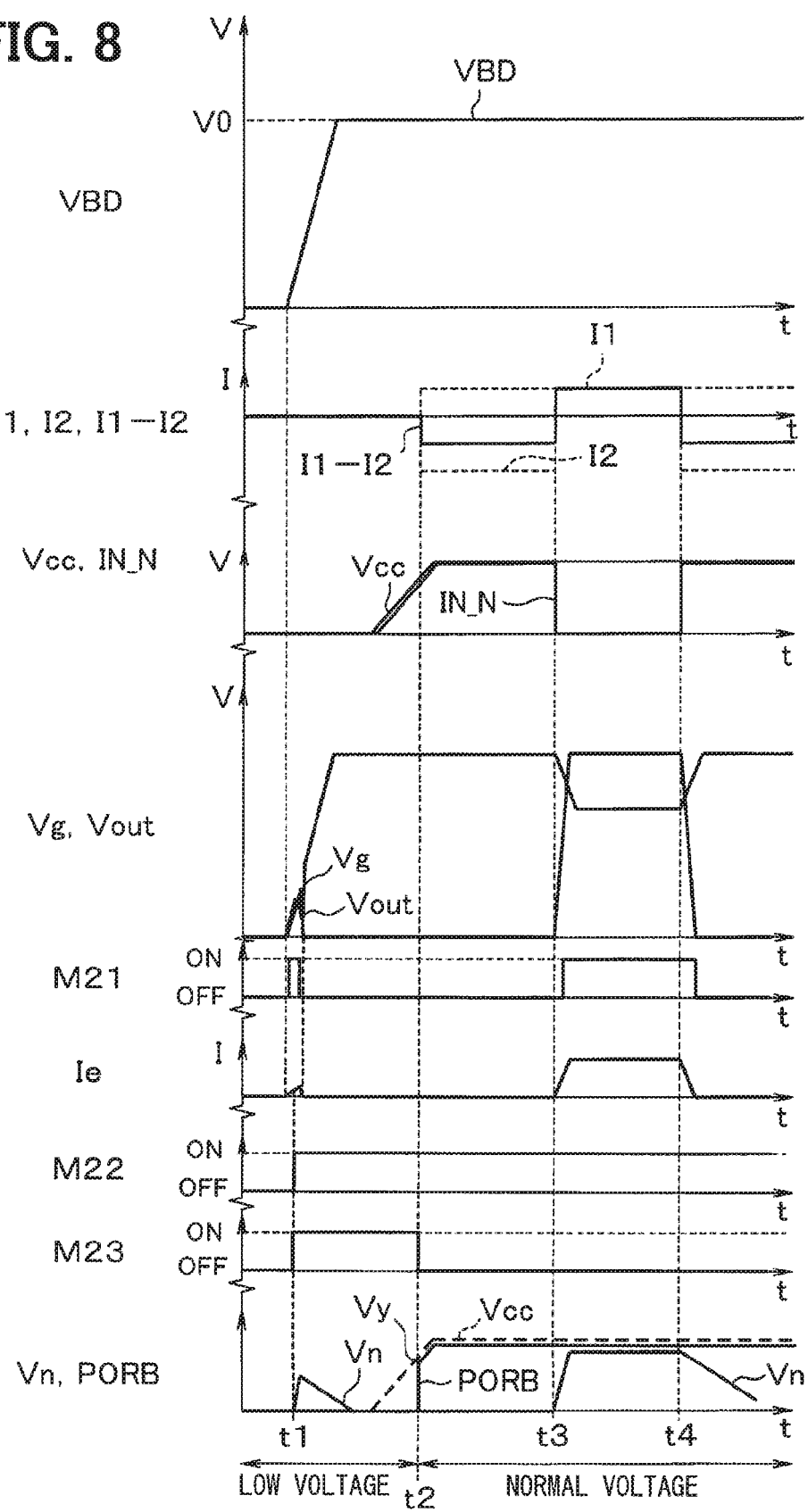
FIG. 8 is a timing chart generally showing an on/off state of each transistor and a signal change at each node in the third embodiment.

FIG. 7 and FIG. 8 show additional exemplary diagrams of a third embodiment. FIG. 7 shows an exemplary configuration of a load driving circuit 201 according to the third embodiment. FIG. 8 shows a timing chart generally corresponding to this exemplary configuration. In the load driving circuit 201 shown in FIG. 7, a P-channel MOS transistor (referred to as output transistor below) M21 is used in place of the output transistor M1 provided in the first embodiment. A source of the output transistor M21 is connected to the battery power supply terminal 6 of the battery power supply voltage VBD and a drain of the output transistor M21 is connected to the output terminal 22. In FIG. 7, the transistors M2 and M3 provided in the first embodiment are indicated as transistors M22 and M23 for simplification of description.

As shown in FIG. 7, the load 23 is connected between the output terminal 22 and the ground. The load driving circuit 201 includes a pre-driver circuit 209 and a malfunction prevention circuit 224, which is in place of the malfunction prevention circuit 24. The pre-driver circuit 209 generates a trapezoidal waveform voltage by supplying to and drawing from the output transistor M21 currents by using the battery power supply voltage VBD and applies it. The pre-driver circuit 209 controls current supply to the load 23 by controlling the output terminal 22 of the load driving circuit 201 to a voltage close to the battery power supply voltage VBD or the ground voltage 0V.

The malfunction prevention circuit 224 is different from that in the first embodiment in that the simplified power supply circuit 26 is provided at a drain side of the output transistor M21. Since its internal configuration is the same, it is indicated with the same reference numeral.

The third embodiment is different from the first embodiment in that a current mirror circuit 41 is provided in a series circuit of the resistor 27 and the drain-source paths of the transistors M22 and M23. The current mirror circuit 41 includes a diode-connected PNP transistor 42 and a PNP transistor 43. The PNP transistor 42 is connected to the battery power supply terminal 6 of the battery power supply voltage VBD. A base of the PNP transistor 43 is connected to a base of the PNP transistor 42. An emitter of the PNP transistor 43 is connected to the battery power supply terminal 6. A collector of the PNP transistor 43 is connected to a gate node N201 of the output transistor M21.

With the configuration described above, when both of the transistors M22 and M23 turn on at time point t1 in FIG. 8, a collector current flows in the PNP transistor 42 and responsively a collector current flows in the PNP transistor 43 as well. Thus the gate node 201 of the output transistor M11 is pulled up to the battery power supply voltage VBD. Then the third embodiment operates similarly to the operations of the foregoing embodiments and hence no more description is made. The third embodiment also provides the similar operation and advantage as the foregoing embodiments.

Fourth Embodiment

Figure 9:
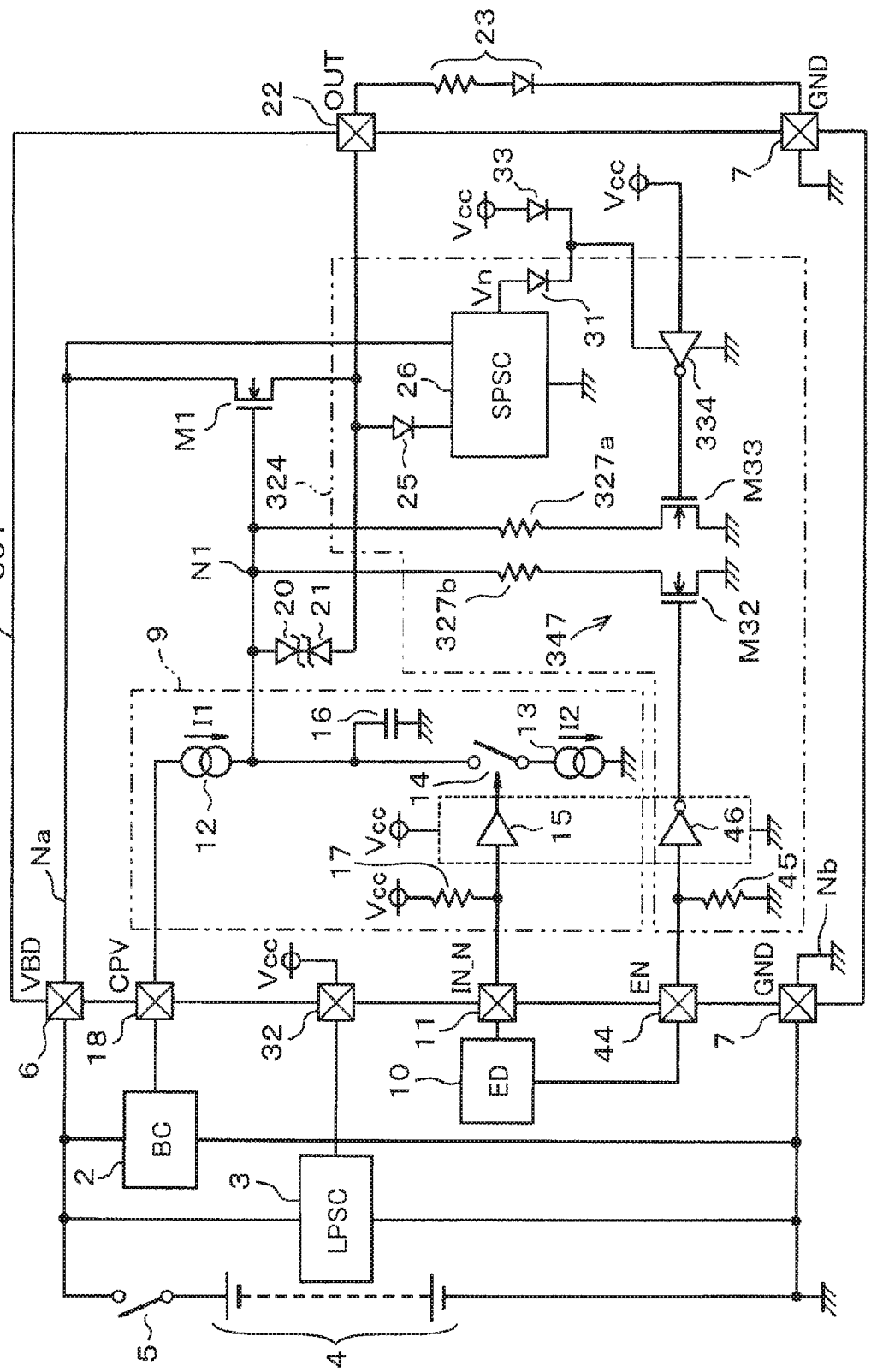
FIG. 9 is an electric circuit diagram generally showing a fourth embodiment of a load driving circuit.
Figure 10:
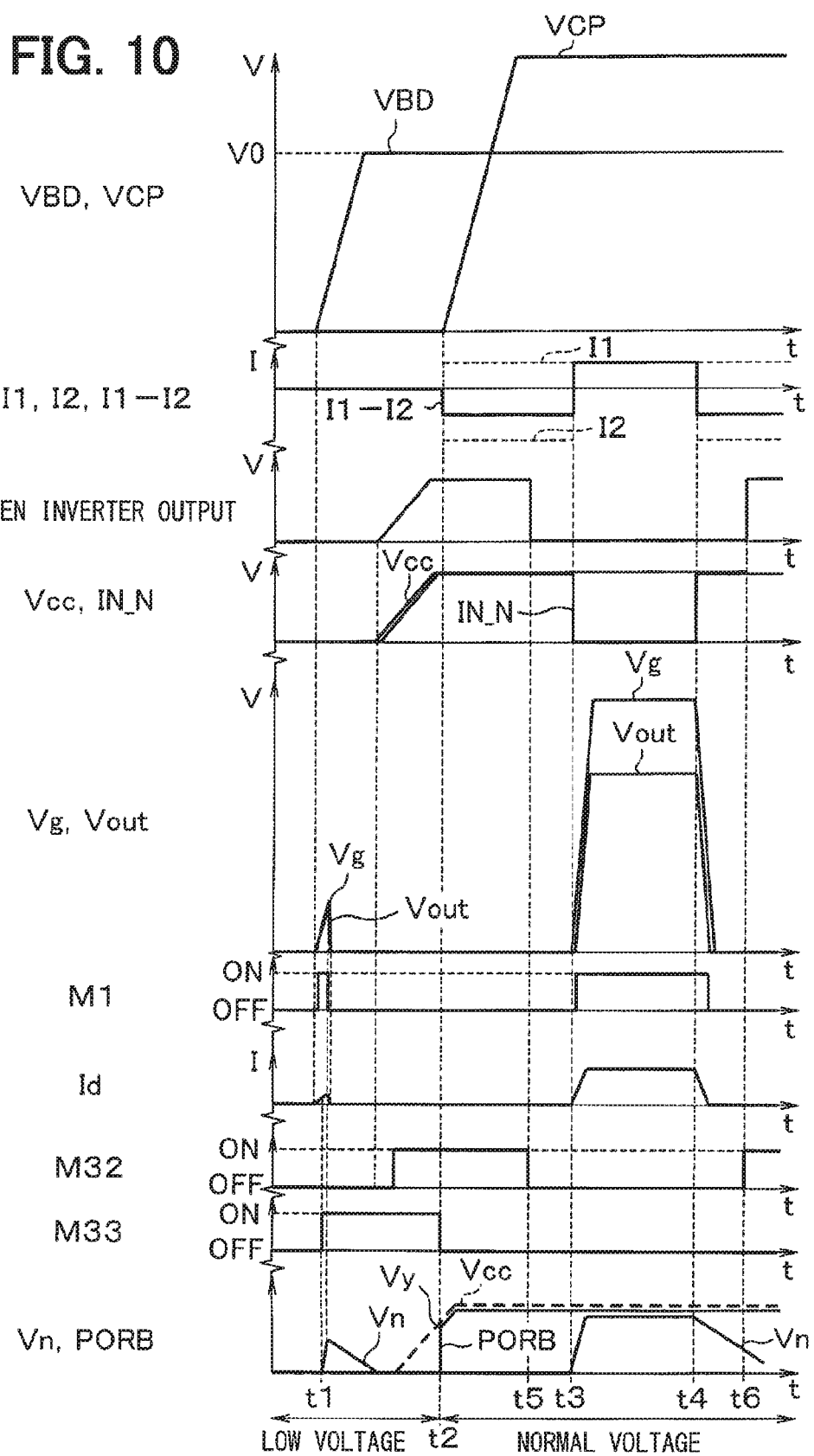
FIG. 10 is a timing chart generally showing an on/off state of each transistor and a signal change at each node in the fourth embodiment.

FIG. 9 and FIG. 10 show additional explanatory diagrams of a fourth embodiment. FIG. 9 shows an exemplary configuration of a load driving circuit 301 according to the fourth embodiment. FIG. 10 shows a timing chart generally corresponding to this exemplary configuration. In the load driving circuit 301 shown in FIG. 9, N-channel MOS transistors (referred to as transistors below) M32 and M33 are used in place of the transistors M2 and M3 provided in the first embodiment.

A malfunction prevention circuit 324 includes a diode 25, a simplified power supply circuit 26, a diode 31, an inverter 34 as a first inverter, an N-channel MOS transistor (referred to as transistor below) M33 and a resistor 327a. The malfunction prevention circuit 324 further includes an enabling circuit 347, which pulls down the voltage of the gate node N1 of the output transistor M1 in accordance with an input signal applied to an enable terminal 44. The transistor M33 is used as a fourth transistor.

The output of the simplified power supply circuit 26 is used as an operation voltage supply source for the inverter 334 through the diode 25. The inverter 334 receives the output voltage Vcc of the logic power supply circuit 3, inverts this input voltage logically and outputs the inverted voltage to the gate of the transistor M33. The inverter 334 has the similar circuit configuration as the inverter 34 shown in FIG. 1 and hence no detailed description will be made. A drain-source path of the transistor M33 and the resistor 327a are connected in series between the gate of the output transistor M1 and the ground.

The load driving circuit 301 in the fourth embodiment has the enable terminal 44. The enable terminal 44 is provided to enable the external device 10 of the load driving circuit 301 to switch over validation and invalidation of the operation of the load driving circuit 301. An enabling circuit 347 is connected to the enable terminal 44. The enabling circuit 347 includes a pull-down resistor 45, an inverter 46, an N-channel MOS transistor (referred to as transistor below) M32 and a resistor 327b. The pull-down resistor 45 and the inverter 46 are connected to the enable terminal 44. The inverter 46 is operable with operating power supply from the logic power supply circuit 3. The inverter 46 has the same configuration as the inverter 34 shown in FIG. 1, for example, and operates as an enable signal receiving circuit, which receives an enable signal EN applied to the enable terminal 44. An output of the inverter 46 is applied to the gate of the transistor M32. The drain-source path of the transistor 32 and the resistor 327b are connected in series between the gate and the ground of the output transistor M1.

In the fourth embodiment, the load driving circuit 301 has two separate configurations. In one configuration, the simplified power supply circuit 26 applies a voltage to the gate of the transistor M33 through the inverter 334 when activated. In the other configuration, the enabling circuit 347 applies a voltage to the gate of the transistor M32 in response to the enable signal EN.

An operation of the fourth embodiment will be described below. For activation, at time point t1 in FIG. 10, the simplified power supply circuit 26 supplies the operating voltage to the inverter 334 through the diode 31. The inverter 334 applies its output, which is generated at the activation time, to the gate of the transistor M33. That is, the gate voltage of the transistor M33 increases with an increase in the output voltage Vn of the simplified power supply circuit 26. The gate of the output transistor M1 is maintained at the ground voltage 0V. Then the simplified power supply circuit 26 decreases the output voltage Vn. However, before or after that the logic power supply circuit 3 raises the output voltage Vcc.

For this reason, as shown in FIG. 10, the inverter 334 turns on the transistor M33 with the voltage Vn supplied from the simplified power supply circuit 26. As a result, the gate node N1 of the output transistor M1 is set to the ground voltage 0V. While the transistor M33 is in the on-state, the operation of the load driving circuit 301 is invalidated and the gate control operation of the pre-driver circuit 9 for the output transistor M1 is invalidated.

When the output voltage Vn of the simplified power supply circuit 26 decreases, the transistor M33 turns off and renders the gate node N1 of the output transistor M1 to be non-conductive. Since the input voltage to the battery power supply voltage VBD reaches the set voltage V0 before this time point, the output transistor M1 does not turn on by itself. Thus the output transistor M1 remains in the off-state. When the output voltage Vcc of the logic power supply circuit 3 changes to the normal voltage, the inverter 334 continuously outputs the ground voltage 0V and transistor M33 maintains the off-state.

As shown in a period from time point t1 to time point t5 in FIG. 10, when a non-active-level "L" of the enable signal EN is continuously applied to the enable terminal 44, the output voltage Vcc of the logic power supply circuit 3 rises and the inverter 46 turns on the transistor M32. Thus the logic power supply circuit 324 invalidates the gate control operation of the pre-driver circuit 9 for the output transistor M1.

While at least one of the transistors M33 and M32 continues to be in the on-state, the operation of the load driving circuit 301 is invalidated and the gate control operation of the pre-driver circuit 9 for the output transistor M1 is invalidated.

Further, as shown in a period from time point t5 to time point t6 in FIG. 10, when an active-level "H" of the enable signal EN is continuously applied to the enable terminal 44, the output voltage of the inverter 46 changes to the ground voltage 0V, the transistor M32 turns off and the logic power supply circuit 324 validates the gate control operation of the pre-driver circuit 9. That is, when both of the transistors M32 and M33 are turned off, the operation of the load driving circuit 301 is validated and the gate control operation of the pre-driver circuit 9 for the transistor M1 is validated. The other operation of the logic power supply circuit 324 is similar to that described with reference to the foregoing embodiments and hence no more description is made. As described above, even in the configuration having the enable terminal 44, similar operation and advantage are provided.

Fifth Embodiment

Figure 11:
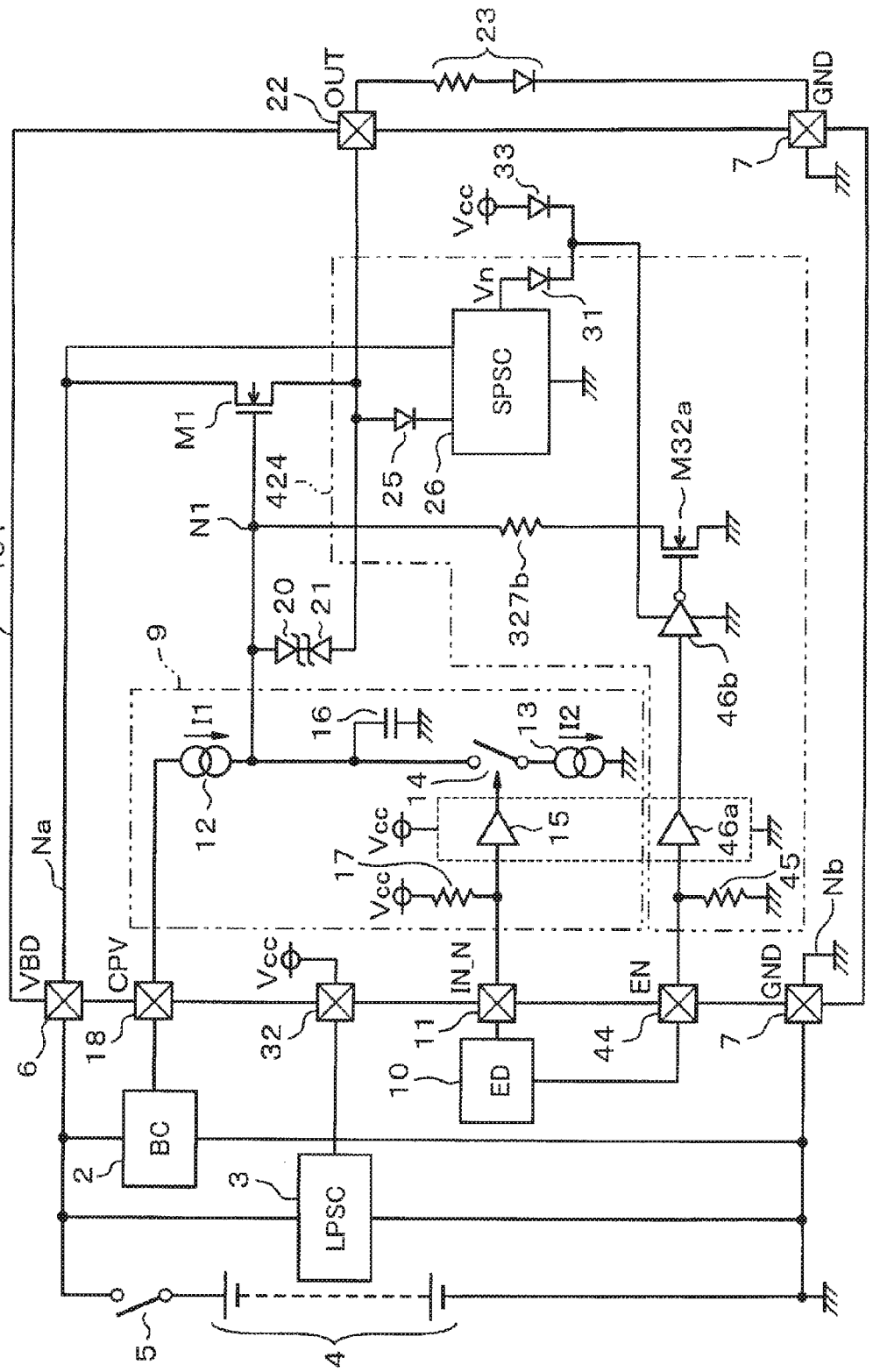
FIG. 11 is an electric circuit diagram generally showing a fifth embodiment of a load driving circuit.
Figure 12:
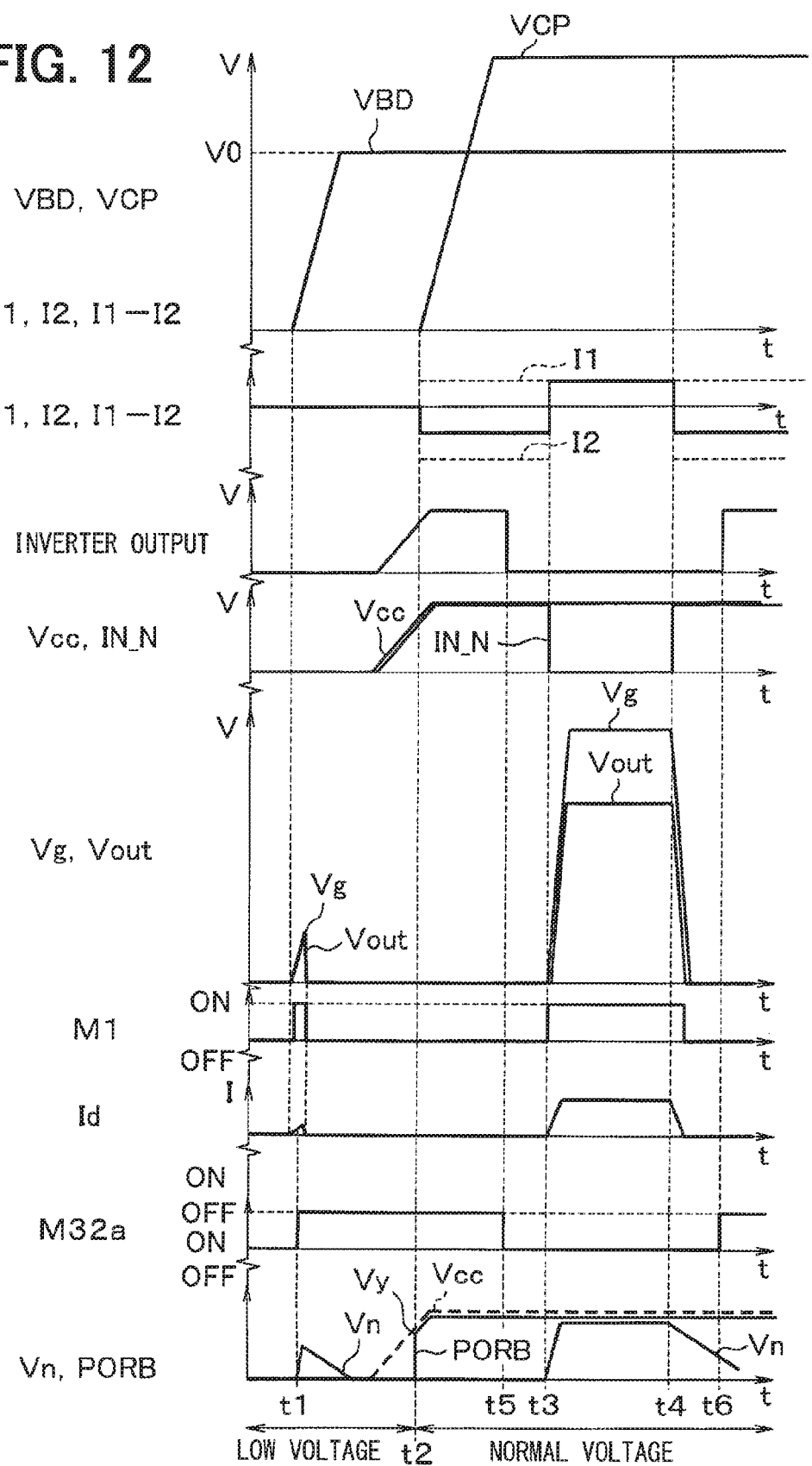
FIG. 12 is a timing chart generally showing an on/off state of each transistor and a signal change at node in the fifth embodiment.

FIG. 11 and FIG. 12 show additional explanatory diagrams of a fifth embodiment. FIG. 11 shows an exemplary configuration of a load driving circuit 401 according to the fifth embodiment. FIG. 12 shows a timing chart generally corresponding to this exemplary configuration. The load driving circuit 401 shown in FIG. 11 includes a malfunction prevention circuit 424, in which an N-channel MOS transistor (referred to as transistor below) M32a is provided in place of the transistors M2 and M3 of the first embodiment. The transistor M32a is used as a fifth transistor.

The load driving circuit 401 includes the enable terminal 44. The enable terminal 44 is provided to enable the external device 10 of the load driving circuit 401 to switch over validation and invalidation of the operation of the load driving circuit 401. The pull-down resistor 45 and a voltage buffer 46a are connected to the enable terminal 44. The voltage buffer 46a is operable with operating power supply from the logic power supply circuit 3. The voltage buffer 46a shapes a waveform of the signal inputted from the enable terminal 44 and outputs it to an inverter 46b, which is provided as a second inverter. The output of the simplified power supply circuit 26 is used as the operating power voltage of the inverter 46b through the diode 31.

The output of the inverter 46b is applied to the gate of the transistor 32a. A resistor 327b and a drain-source path of the transistor 32a are connected in series between the gate of the output transistor M1 and the ground. The voltage buffer 46a and the inverter 46b operate as an enable signal receiving circuit, which receives the enable signal EN applied to the enable terminal 44.

In the fifth embodiment, the load driving circuit 401 is provided with the inverter 46b, which is used in common by two configurations. In one configuration, the simplified power supply circuit 26 applies a voltage to the gate of the transistor M32a through the inverter 46b when activated. In the other configuration, the enable signal EN is received and a voltage is applied to the gate of the transistor M32a in response to the enable signal EN.

An operation of the fifth embodiment will be described below. Before the activation, the power supply voltage Vcc is the ground voltage 0V and the initial output voltage of the voltage buffer 46a is also the ground voltage 0V. At the activation time, when the battery power supply voltage VBD is supplied, the simplified power supply circuit 26 supplies the output voltage Vn as the operating voltage of the inverter 46b through the diode 31. The initial output voltage 0V of the voltage buffer 46a is applied to the inverter 46b. When the output voltage Vn of the activation time is supplied as the operating power from the simplified power supply circuit 26 through the diode 31, the output voltage Vn is outputted to the gate of the transistor M32a through the inverter 46b in response to the rise of the output voltage Vn. That is, since the gate voltage of the transistor M32a rises with the rise of the output voltage Vn of the simplified power supply circuit 26, the transistor 32a turns on and the gate node N1 of the output transistor M1 is maintained at the ground voltage 0V, which is a predetermined voltage.

For activation, at time point t1 in FIG. 10, the simplified power supply circuit 26 supplies the operating voltage to the inverter 334 through the diode 31. The inverter 334 applies its output, which is generated at the activation time, to the gate of the transistor M33. That is, the gate voltage of the transistor M33 increases with an increase in the output voltage Vn of the simplified power supply circuit 26. Thus the transistor M32a turns on. When the battery power supply voltage VBD changes to the set voltage V0 at the time of activation and the voltage change generally ends, the coupling through the drain-gate path capacitance of the output transistor M1 also ends and the output transistor M1 does not turn on by itself. Since the simplified power supply circuit 26 maintains the electric charge in the parasitic capacitance 30 during a period, in which at least the battery power supply voltage VBD changes to the set voltage V0 at the activation time, the output voltage Vn is maintained at the predetermined voltage, which exceeds the ground voltage 0V. The transistor M32 thus continues to be in the on-state and is prevented from malfunction. During the period, in which the transistor M32a is in the on-state, the operation of the load driving circuit 401 is invalidated and the gate control operation for the output transistor M1 by the pre-driver circuit 9 is invalidated. Then, as shown in a period from time point t1 to time point t2 in FIG. 12, when the output voltage Vcc of the logic power supply circuit 3 starts to rise and reaches the normal voltage, the inverter 46b continues to output the ground voltage 0V normally. The transistor M32a continues to be in the on-state with its gate voltage being maintained.

Then, even when the non-active-level "L" of the enable signal EN is continuously applied to the enable terminal 44, the malfunction prevention circuit 424 invalidates the gate control operation of the pre-driver circuit 9 for the output transistor M1 since the transistor M32a continues to be in the on-state.

When the active level "H" of the enable signal EN is applied to the enable terminal 44, the inverter 46b turns off the transistor 32a and the malfunction prevention circuit 424 validates the gate control operation of the pre-driver circuit 9 for the output transistor M1. That is, with the transistor M32a being turned off, the operation of the load driving circuit 401 is validated and the gate control operation of the pre-driver circuit 9 for the transistor M1 is validated. As described above, the fifth embodiment also provides the similar operation and advantage as the foregoing embodiments.

According to the fifth embodiment, the output of the simplified power supply circuit 26 and the output of the logic power supply circuit 3 are connected to be in a wired-OR circuit form to supply power to the transistor 32a. For this reason, even when the output of the simplified power supply circuit 26 falls and the operation of the inverter 46b is invalidated, the logic power supply circuit 3 is activated thereafter and the operation of the inverter 46b is validated. The inverter 46b thus has a function of pull-down control for the output transistor M1 at the time of activation and input of the battery power supply voltage VBD and a function of receiving the enable signal EN. As a result, a circuit size is reduced.

Other Embodiment

The load driving circuit is not limited to the embodiments described above and may be modified as follows.

Configuration of each embodiment may be combined.

Each output transistor M1, M11, M2, M3, M4, M5, M6, M21, M22, M23, M32, M32a, M33 or the like is not limited to the type exemplified in the foregoing embodiments. For example, a MOS transistor or a bipolar junction transistor may be used.

Each malfunction prevention circuit 24, 214, 224, 324 or 424 is not limited to the configuration exemplified in the foregoing embodiments but may be in a different configuration. For example, the malfunction prevention circuit may be in any configuration as far as at least a part of it is provided is a power supply path, which is connected in series to any one of two power supply terminals (for example, drain and source) of the output transistor M1, M11 or M21.

Although the battery power supply voltage VBD and the power supply voltage Vcc are used as the main power supply voltage and the sub-power supply voltage, respectively, voltages other than VBD and Vcc may be used.

What is claimed is:
1. A load driving circuit, which controls power supply to a load connected to an output terminal by using a main power supply voltage supplied between two power supply nodes and a sub-power supply voltage generated from the main power supply voltage by a sub-power supply circuit, the load driving circuit comprising:

an output transistor having a control terminal and two power supply terminals, which are connected to one power supply node of the two power supply nodes and the output terminal;

a pre-driver circuit for applying a control signal corresponding to an input signal to the control terminal of the output transistor at normal time; and a malfunction prevention circuit including a simplified power supply circuit, which is provided at least partly in a power supply path connected in series with either one of the two power supply terminals of the output transistor, and which is activated in response to power supply to the two power supply terminals of the output transistor at activation time and earlier than activation of the sub-power supply voltage of the sub-power supply circuit by using the main power supply voltage at the activation time, wherein the malfunction prevention circuit sets the control terminal of the output transistor to a predetermined voltage, which turns off the output transistor, by using an output voltage generated by the simplified power supply circuit, and wherein the malfunction prevention circuit invalidates the predetermined voltage set at the control terminal of the output transistor, when the sub-power supply voltage of the sub-power supply circuit changes from a pre-activation voltage to a normal operation assurance voltage, which assures a normal operation of an entirety of the load driving circuit, after setting of the predetermined voltage at the control terminal of the output transistor.

2. The load driving circuit according to claim 1, wherein:
the simplified power supply circuit includes a resistor and a second transistor;
the resistor of the simplified power supply circuit is provided in the power supply path to the output transistor; and
the second transistor of the simplified power supply circuit has a power supply terminal and is configured to maintain an output voltage of the power supply terminal in accordance with a current flowing in the resistor at the activation time until at least the main power supply voltage generated at the activation time reaches a set voltage so that the output voltage generated at the power supply terminal of the second transistor is used as an output of the activation time.

3. The load driving circuit according to claim 1, wherein:
the output transistor includes an N-channel MOS transistor, two power supply terminals of which are connected between the output terminal and the one power supply node supplied with the main power supply voltage;
the load is connected between the output terminal and an other power supply node of the two power supply nodes; and
the predetermined voltage is a voltage applied to the other power supply node.

4. The load driving circuit according to claim 1, wherein:
the load is connected between the output terminal and the one power supply node supplied with the main power supply voltage;
the output transistor includes an N-channel MOS transistor, two power supply terminals of which are connected between the output terminal and an other power supply node of the two power supply nodes; and
the predetermined voltage is a voltage applied to the other power supply node.

5. The load driving circuit according to claim 1, wherein:
the output transistor includes a P-channel MOS transistor, two power supply terminals of which are connected between the output terminal and the one power supply node supplied with the main power supply voltage;
the load is connected between the output terminal and the one power supply node of the two power supply nodes; and
the predetermined voltage is a voltage applied to the one power supply node.

6. The load driving circuit according to claim 1, wherein:
an output voltage generated by the simplified power supply circuit at the activation time and the sub-power supply voltage of the sub-power supply circuit are connected in a wired-OR circuit configuration; and
the malfunction prevention circuit sets the control terminal of the output transistor to the predetermined voltage by using an output voltage of the wired-OR circuit configuration.

7. The load driving circuit according to claim 1, wherein:
the malfunction prevention circuit includes a third transistor and a detection circuit;
the third transistor renders the control terminal of the output transistor to be conductive and non-conductive to the predetermined voltage in accordance with a control signal applied to a control terminal of the third transistor; and
the detection circuit detects a change of the sub-power supply voltage of the sub-power supply circuit from the pre-activation voltage to the normal operation assurance voltage and applies the control signal to the control terminal of the third transistor so that the third transistor renders the control terminal of the output transistor to be non-conductive.

8. The load driving circuit according to claim 1, wherein:
the malfunction prevention circuit includes a fourth transistor and a first inverter;
the fourth transistor renders the control terminal of the output transistor to be conductive and non-conductive to the predetermined voltage in accordance with a control signal applied to a control terminal of the fourth transistor; and
the first inverter uses the output voltage generated by the simplified power supply circuit at the activation time as an operating voltage and applies the output voltage of the simplified power supply circuit to the control terminal of the fourth transistor so that the fourth transistor renders the control terminal of the output transistor to be conductive to the predetermined voltage.

9. The load driving circuit according to claim 1, wherein:
the malfunction prevention circuit includes a fifth transistor, a second inverter, and an enable signal receiving circuit;
the fifth transistor renders the control terminal of the output transistor to be conductive and non-conductive to the predetermined voltage in accordance with a control signal applied to a control terminal of the fifth transistor;
the second inverter uses the output voltage generated by the simplified power supply circuit at the activation time as an operating voltage and applies the output voltage of the simplified power supply circuit to the control terminal of the fifth transistor so that the fifth transistor renders the control terminal of the output transistor to be conductive to the predetermined voltage;
the enable signal receiving circuit receives an enable signal while operating with the sub-power supply voltage of the sub-power supply circuit; and
the second inverter applies, when the enable signal is received by the enable signal receiver circuit, a control signal to a control terminal of the fifth transistor so that the fifth transistor renders the control terminal of the output transistor to be non-conductive.

10. The load driving circuit according to claim 1, wherein:
the pre-driver circuit has a function of through rate control for the signal applied to the control terminal of the output transistor.

11. The load driving circuit according to claim 1, wherein:
the load driving circuit is formed as a semiconductor integrated circuit.

* * * * *